United States Patent
Kuwahara et al.

(10) Patent No.: US 11,243,241 B2
(45) Date of Patent: Feb. 8, 2022

(54) NOISE DETECTION DEVICE

(71) Applicant: MITSUBISHI ELECTRIC CORPORATION, Tokyo (JP)

(72) Inventors: Takashi Kuwahara, Tokyo (JP); Yoshihiro Akeboshi, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 382 days.

(21) Appl. No.: 16/315,239

(22) PCT Filed: Aug. 30, 2016

(86) PCT No.: PCT/JP2016/075317
§ 371 (c)(1),
(2) Date: Jan. 4, 2019

(87) PCT Pub. No.: WO2018/042513
PCT Pub. Date: Mar. 8, 2018

(65) Prior Publication Data
US 2021/0208188 A1 Jul. 8, 2021

(51) Int. Cl.
G01R 29/26 (2006.01)
H03K 5/24 (2006.01)

(52) U.S. Cl.
CPC ............ G01R 29/26 (2013.01); H03K 5/24 (2013.01)

(58) Field of Classification Search
None
See application file for complete search history.

(56) References Cited

U.S. PATENT DOCUMENTS

2007/0188155 A1* 8/2007 Oki ................ H02M 1/32
323/280
2008/0309378 A1* 12/2008 Hirose ............ G01R 31/2884
327/50
2010/0246227 A1* 9/2010 Shimizu ............ H02M 3/156
363/126

FOREIGN PATENT DOCUMENTS

| JP | 59-213224 A | 12/1984 |
| JP | 60-24716 A | 2/1985 |
| JP | 60-39365 A | 3/1985 |
| JP | 3-292675 A | 12/1991 |

OTHER PUBLICATIONS

German Office Action for German Application No. 112016007071.3, dated May 28, 2020, with an English translation.
Office Action dated Aug. 10, 2021 in corresponding German Patent Application No. 11 2016 007 071.3.

* cited by examiner

Primary Examiner — Nasima Monsur
(74) Attorney, Agent, or Firm — Birch, Stewart, Kolasch & Birch, LLP

(57) ABSTRACT

A noise detection circuit includes an open and close switch connected onto a signal line for transmitting a detection signal of an extraneous noise, and the open and close switch is configured so as to be in an off state during a time period when the switching of the conduction state of a solid state switch is performed by a control circuit, whereas the open and close switch is configured so as to be in an on state during a time period when the switching of the conduction state of the solid state switch is not performed. As a result, an extraneous noise occurring irregularly can be detected.

4 Claims, 3 Drawing Sheets

NOISE DETECTION DEVICE

TECHNICAL FIELD

The present invention relates to a noise detection device that detects an extraneous noise.

BACKGROUND ART

For example, in a circuit board included in, for example, a personal computer or a mobile phone, because the occurrence of a malfunction may be caused when a signal including a noise is inputted to the circuit, it is necessary to take a measure to prevent any signal including a noise from being inputted to the circuit.

In following Patent Literature 1, a noise rejection device that prevents a signal including a noise from being inputted to a circuit by turning off a switch on a signal line in synchronization with a noise occurring periodically is disclosed.

CITATION LIST

Patent Literature

Patent Literature 1: Japanese Unexamined Patent Application Publication No. Sho 60-39365

SUMMARY OF INVENTION

Technical Problem

Because the conventional noise rejection device is configured as above, a signal including a noise occurring periodically can be prevented from being inputted to a circuit. However, there is a problem that it is impossible to detect an extraneous noise occurring irregularly such as an electro-static discharge (ESD).

The present invention is made in order to solve the above-mentioned problem, and it is therefore an object of the present invention to provide a noise detection device that can detect an extraneous noise occurring irregularly.

Solution to Problem

A noise detection device according to the present invention includes: a switching element connected between an input terminal to which a DC input voltage is applied, and a power supply terminal; a control circuit to compare a power supply voltage applied to the power supply terminal and a threshold voltage, and to switch a conduction state of the switching element in accordance with a result of the comparison between the power supply voltage and the threshold voltage; a noise detection sensor to detect an extraneous noise; and a noise detection circuit to amplify a detection signal of an extraneous noise outputted from the noise detection sensor in a state in which the power supply voltage applied to the power supply terminal is supplied, and to output the detection signal amplified thereby. The noise detection circuit includes an open and close switch connected onto a signal line to transmit the detection signal of the extraneous noise, and the open and close switch is in an opened state during a time period when switching of the conduction state of the switching element is performed by the control circuit, and is in a closed state during a time period when the switching of the conduction state of the switching element is not performed.

Advantageous Effects of Invention

According to the present invention, because the noise detection circuit includes the open and close switch connected onto the signal line for transmitting a detection signal of an extraneous noise, and the open and close switch is configured so as to be in the opened state during a time period when the switching of the conduction state of the switching element is performed by the control circuit, whereas the open and close switch is configured so as to be in the closed state during a time period when the switching of the conduction state of the switching element is not performed, there is provided an advantage of being able to detect an extraneous noise occurring irregularly.

DESCRIPTION OF EMBODIMENTS

Hereafter, in order to explain this invention in greater detail, embodiments of the present invention will be described with reference to the accompanying drawings.

Embodiment 1

Figure 1:
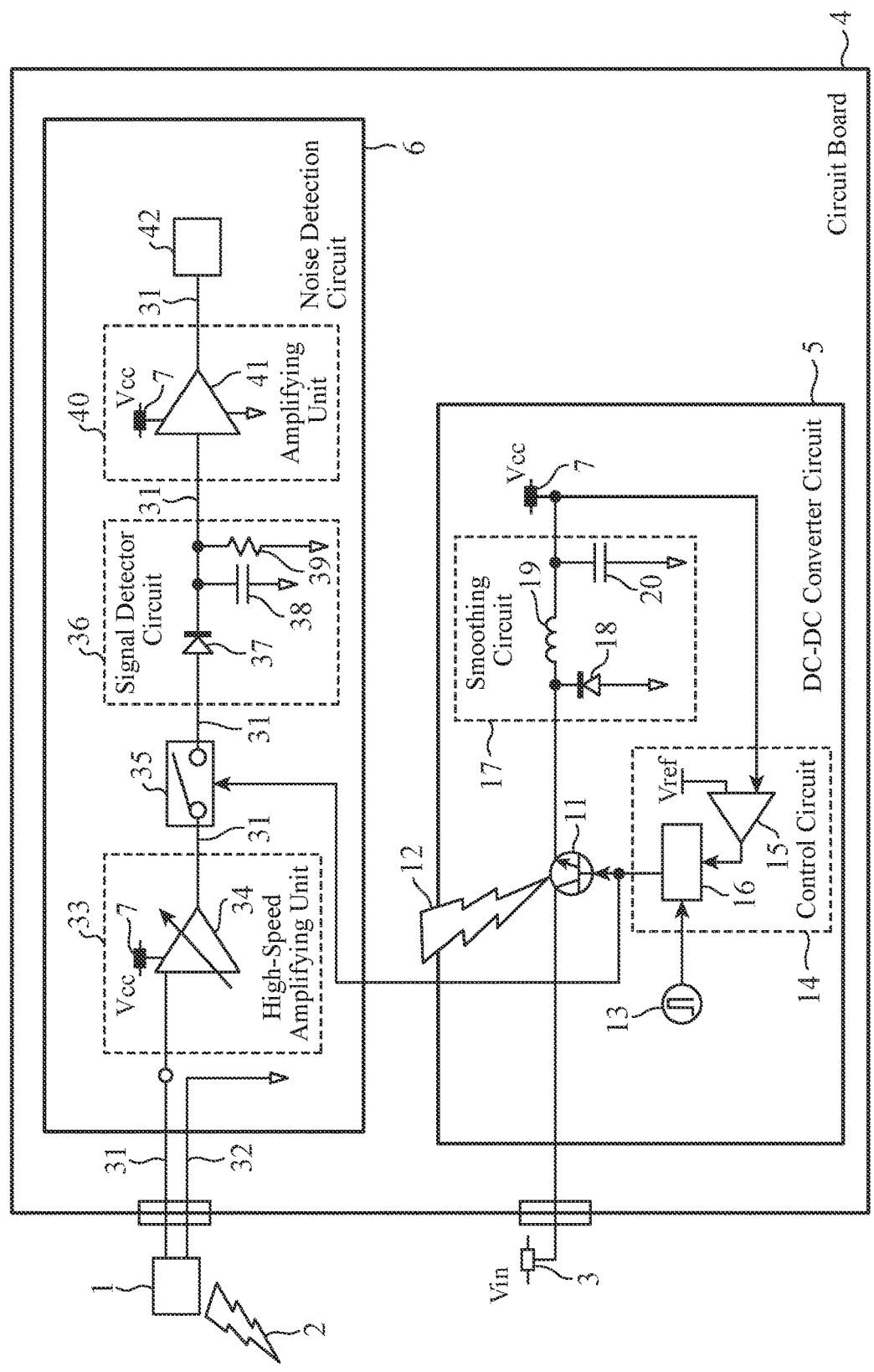
FIG. 1 is a schematic diagram showing a noise detection device according to Embodiment 1 of the present invention.

FIG. 1 is a schematic diagram showing a noise detection device according to Embodiment 1 of the present invention.

In FIG. 1, a noise detection sensor 1 is a sensor that detects an extraneous noise 2 occurring irregularly, for example an ESD or the like, and, when detecting an extraneous noise 2, outputs a detection signal of the extraneous noise 2.

As the noise detection sensor 1, for example, an electric field probe, a magnetic field probe, an electromagnetic field probe, or the like can be used.

A voltage input terminal 3 is an input terminal to which a Direct Current (DC) input voltage Vin is applied.

A circuit board 4 includes a DC-DC converter circuit 5 and a noise detection circuit 6.

The DC-DC converter circuit 5 is a DC voltage conversion circuit that converts the DC input voltage Vin applied to the voltage input terminal 3 into a power supply voltage Vcc, and outputs the power supply voltage Vcc to a power supply terminal 7.

The noise detection circuit 6 is a circuit that amplifies the detection signal of an extraneous noise 2 outputted from the noise detection sensor 1 in a state in which the power supply voltage Vcc applied to the power supply terminal 7 is supplied as a power supply voltage for driving, and outputs the detection signal amplified thereby.

A solid state switch 11 is a switching element connected between the voltage input terminal 3 and the power supply terminal 7.

As the solid state switch 11, for example, a diode, a transistor, or the like can be used.

In the example of FIG. 1, as the solid state switch 11, a transistor is used, a collector terminal of the transistor is connected to the voltage input terminal 3, and an emitter terminal of the transistor is connected to a smoothing circuit 17.

In the case in which the transistor is used as the solid state switch 11, a large voltage change caused by switching of a conduction state between the collector terminal and the emitter terminal from an off state (non-conducting state) in which no conduction occurs to an on state (conducting state) in which conduction occurs causes a strong ringing of the order of several hundreds of MHz to occur. Further, a large voltage change caused by switching of the conduction state between the collector terminal and the emitter terminal from the on state to the off state causes a strong ringing of the order of several hundreds of MHz to occur.

The occurrence of a ringing causes a switching noise 12 to occur from the solid state switch 11.

An oscillating circuit 13 is a circuit that generates a pulse signal periodically and repeatedly.

A control circuit 14 is a circuit that includes a comparator 15 and a control signal generating unit 16, and that, when receiving a pulse signal from the oscillating circuit 13, switches the conduction state of the solid state switch 11 in accordance with a result of a comparison between the power supply voltage Vcc applied to the power supply terminal 7 and a threshold voltage Vref.

The comparator 15 compares the power supply voltage Vcc smoothed by the smoothing circuit 17, i.e., the power supply voltage Vcc applied to the power supply terminal 7, and the threshold voltage Vref, and outputs a result of the comparison between the power supply voltage Vcc and the threshold voltage Vref.

When receiving a pulse signal from the oscillating circuit 13, and when the comparison result outputted from the comparator 15 shows that the power supply voltage Vcc is less than the threshold voltage Vref, the control signal generating unit 16 generates a control signal, the control signal causing the conduction state to be switched from the off state to the on state, and then causing the conduction state to return to the off state.

When receiving a pulse signal from the oscillating circuit 13, and when the comparison result outputted from the comparator 15 shows that the power supply voltage Vcc is equal to or greater than the threshold voltage Vref, the control signal generating unit 16 generates a control signal causing the off state to be maintained.

The smoothing circuit 17 is a circuit that includes a diode 18, an inductor 19, and a capacitor 20, and that smooths the power supply voltage Vcc outputted from the solid state switch 11 and outputs the power supply voltage Vcc smoothed thereby to the power supply terminal 7 and the control circuit 14.

The diode 18 has an anode terminal connected to the ground and a cathode terminal connected to an output side of the solid state switch 11, and is in an on state when the conduction state of the solid state switch 11 is the off state, whereas the diode is in an off state when the conduction state of the solid state switch 11 is the on state.

The inductor 19 has an end connected to the output side of the solid state switch 11 and the other end connected to the power supply terminal 7.

The capacitor 20 has an end connected to the power supply terminal 7 and the other end connected to the ground, and becomes charged when the conduction state of the solid state switch 11 is the on state, whereas the capacitor becomes discharged when the conduction state of the solid state switch 11 is the off state.

Signal lines 31 and 32 are lines each for transmitting the detection signal of an extraneous noise 2 outputted from the noise detection sensor 1, and the signal line 32 is connected to the ground.

A high-speed amplifying unit 33 includes a high-speed operational amplifier 34 that can respond to a short-duration pulse signal having a narrow pulse width, i.e., an extraneous noise 2, and amplifies the detection signal of an extraneous noise 2 outputted from the noise detection sensor 1 and outputs the detection signal amplified thereby to an open and close switch 35.

The high-speed operational amplifier 34 operates at a speed of the order of nsec, and amplifies the detection signal of an extraneous noise 2 outputted from the noise detection sensor 1 in the state in which the power supply voltage Vcc applied to the power supply terminal 7 is supplied as the power supply voltage for driving, and outputs the detection signal amplified thereby to the open and close switch 35.

When a switching noise 12 occurring from the solid state switch 11 is inputted, the high-speed operational amplifier 34 also amplifies the switching noise 12 and outputs a signal of the switching noise 12 amplified thereby to the open and close switch 35.

The open and close switch 35 is inserted onto the signal line 31, and has an end connected to the high-speed amplifying unit 33 and the other end connected to a signal detector circuit 36.

The open and close switch 35 is in an off state (opened state) during a time period when the switching of the conduction state of the solid state switch 11 is performed by the control circuit 14, whereas the open and close switch is in an on state (closed state) during a time period when the switching of the conduction state of the solid state switch 11 is not performed.

More specifically, when a control signal generated by the control signal generating unit 16 of the control circuit 14 is the control signal causing the conduction state to be switched from the off state to the on state, and then causing the conduction state to return to the off state, the open and close switch 35 is in the off state, whereas when the control signal generated by the control signal generating unit 16 is the control signal causing the off state to be maintained, the open and close switch is in the on state.

The signal detector circuit 36 is a circuit that includes a diode 37, a capacitor 38, and a resistor 39, and that extends the detection signal of an extraneous noise 2 which has passed through the open and close switch 35 to be a long-duration signal.

More specifically, the signal detector circuit 36 widens the pulse width of the detection signal, thereby converts the detection signal into a long-duration pulse signal, and outputs the long-duration pulse signal, as a detection output signal 2a, to an amplifying unit 40.

The diode 37 has an anode terminal connected to the other end of the open and close switch 35 and a cathode terminal connected to the amplifying unit 40, and allows the detection signal of an extraneous noise 2 which has passed through the open and close switch 35 to pass therethrough.

The capacitor 38 has an end connected to the cathode terminal of the diode 37 and the other end connected to the ground.

The resistor 39 has an end connected to the cathode terminal of the diode 37 and the other end connected to the ground.

The amplifying unit 40 includes an operational amplifier 41, amplifies the detection output signal 2a outputted from the signal detector circuit 36 and outputs the detection output signal 2a amplified thereby to a detection notification unit 42.

The operational amplifier 41 operates at a speed lower than that at which the high-speed operational amplifier 34 operates, and, for example, an operational amplifier that operates at a speed of the order of msec can be considered.

The operational amplifier 41 amplifies the detection output signal 2a outputted from the signal detector circuit 36 in the state in which the power supply voltage Vcc applied to the power supply terminal 7 is supplied as the power supply voltage for driving, and outputs the detection output signal 2a amplified thereby to the detection notification unit 42.

When receiving the detection output signal 2a from the amplifying unit 40, the detection notification unit 42 lights, for example, a Light Emitting Diode (LED) lamp or the like.

Next, operations will be explained.

Figure 2:
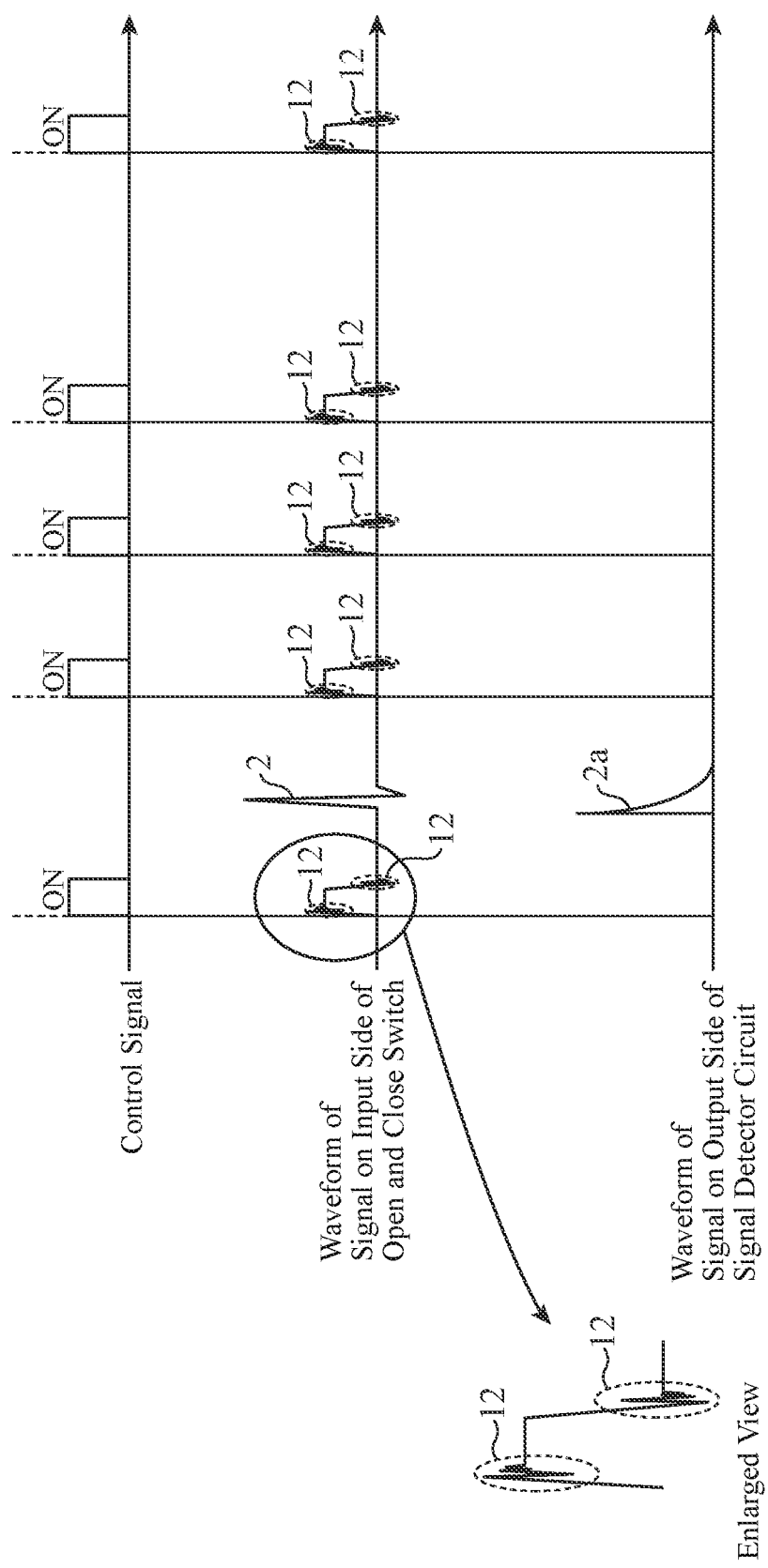
FIG. 2 is an explanatory drawing showing control signals generated by a control signal generating unit 16, signal waveforms on an input side of an open and close switch 35, and a signal waveform on an output side of a signal detector circuit 36.

FIG. 2 is an explanatory drawing showing control signals generated by the control signal generating unit 16, signal waveforms on an input side of the open and close switch 35, and a signal waveform on an output side of the signal detector circuit 36.

The oscillating circuit 13 generates a pulse signal repeatedly and periodically, and outputs the pulse signal generated thereby to the control circuit 14.

In this Embodiment 1, although it is assumed that the oscillating circuit 13 generates a pulse signal P periodically, what is necessary is just to be able to repeatedly output a pulse signal, and time intervals at which a pulse signal is generated are not limited to a fixed time interval.

The control circuit 14 compares the power supply voltage Vcc applied to the power supply terminal 7 and the threshold voltage Vref, and, when receiving a pulse signal from the oscillating circuit 13, switches the conduction state of the solid state switch 11 in accordance with a result of the comparison between the power supply voltage Vcc and the threshold voltage Vref.

The power supply voltage Vcc applied to the power supply terminal 7 is obtained by smoothing the output voltage of the solid state switch 11 through the smoothing circuit 17.

More specifically, although when the solid state switch 11 is in the off state, the output voltage of the solid state switch 11 is substantially equal to 0V, whereas when the solid state switch 11 is in the on state, the output voltage of the solid state switch 11 is substantially equal to the DC input voltage Vin applied to the voltage input terminal 3, since the output voltage of the solid state switch 11 is smoothed by the smoothing circuit 17, the output voltage of the solid state switch 11 becomes equal to a voltage averaged with respect to time.

Hereafter, the operation of the control circuit 14 will be explained concretely.

The comparator 15 of the control circuit 14 compares the power supply voltage Vcc applied to the power supply terminal 7 and the threshold voltage Vref, and outputs a result of the comparison between the power supply voltage Vcc and the threshold voltage Vref to the control signal generating unit 16.

When receiving a pulse signal from the oscillating circuit 13, and when the comparison result outputted from the comparator 15 shows that the power supply voltage Vcc is less than the threshold voltage Vref, the control signal generating unit 16 generates a control signal, the control signal causing the conduction state to be switched from the off state to the on state, and then causing the conduction state to return to the off state, in order to increase the power supply voltage Vcc.

The control signal generating unit 16 outputs the control signal causing the conduction state to return to the off state, to the solid state switch 11 and the open and close switch 35. This control signal is a pulse signal as shown in FIG. 2.

When the solid state switch 11 receives a pulse as shown in FIG. 2, as a control signal, from the control signal generating unit 16, the conduction state is switched from the off state to the on state, and then returns to the off state.

More specifically, the conduction state of the solid state switch 11 is switched from the off state to the on state in synchronization with the rising edge of the pulse signal, and the conduction state is switched from the on state to the off state in synchronization with the falling edge of the pulse signal.

Because a large voltage change is caused by the switching of the conduction state of the solid state switch 11, a strong ringing of the order of several hundreds of MHz occurs.

The occurrence of the ringing causes a switching noise 12 to occur from the solid state switch 11, as shown in FIG. 2. The signal width of the switching noise 12 is of the order of nsec.

When receiving a pulse signal from the oscillating circuit 13, and when the comparison result outputted from the comparator 15 shows that the power supply voltage Vcc is equal to or greater than the threshold voltage Vref, the control signal generating unit 16 generates a control signal causing the off state to be maintained because it is not necessary to increase the power supply voltage Vcc.

When receiving the control signal causing the off state to be maintained from the control signal generating unit 16, the solid state switch 11 maintains the off state.

In this case, because the conduction state of the solid state switch 11 is not switched, no switching noise 12 occurs from the solid state switch 11.

Every time the control circuit 14 receives a pulse signal from the oscillating circuit 13, the control circuit switches the conduction state of the solid state switch 11 in accordance with the result of the comparison between the power supply voltage Vcc applied to the power supply terminal 7 and the threshold voltage Vref, thereby being able to acquire a desired power supply voltage Vcc from the DC input voltage Vin.

When detecting an extraneous noise 2 occurring irregularly, for example an ESD or the like, the noise detection sensor 1 outputs a detection signal of the extraneous noise 2 to the noise detection circuit 6.

In the example of FIG. 2, an extraneous noise 2 occurs at a timing different from that at which the switching noise 12 occurs.

Although the detection signal of the extraneous noise 2 is propagated to the high-speed amplifying unit 33 of the noise detection circuit 6 through the signal line 31, the switching noise 12 may also be propagated to the high-speed amplifying unit 33 of the noise detection circuit 6 while being superposed onto the signal line 31.

When receiving the detection signal of the extraneous noise 2 from the noise detection sensor 1, the high-speed operational amplifier 34 of the high-speed amplifying unit 33 amplifies the detection signal of the extraneous noise 2 outputted from the noise detection sensor 1 in the state in which the power supply voltage Vcc applied to the power supply terminal 7 is supplied as the power supply voltage for driving, and outputs the detection signal amplified thereby to the open and close switch 35.

When the switching noise 12 is superposed, the high-speed operational amplifier 34 also amplifies the switching noise 12 and outputs a signal of the switching noise 12 amplified thereby to the open and close switch 35.

The open and close switch 35 is in the off state during a time period when the switching of the conduction state of the solid state switch 11 is performed by the control circuit 14, whereas the open and close switch is in the on state during a time period when the switching of the conduction state of the solid state switch 11 is not performed.

More specifically, when the control signal generated by the control signal generating unit 16 of the control circuit 14 is the control signal causing the conduction state to be switched from the off state to the on state, and then causing the conduction state to return to the off state, the open and close switch 35 is in the off state.

As a result, the switching noise 12 occurring due to the switching of the conduction state of the solid state switch 11 is not propagated to the signal detector circuit 36, because the switching noise 12 is blocked by the open and close switch 35.

When the control signal generated by the control signal generating unit 16 of the control circuit 14 is the control signal causing the off state to be maintained, the open and close switch 35 is in the on state.

As a result, the extraneous noise 2 occurring during the time period when the conduction state of the solid state switch 11 is not switched is propagated to the signal detector circuit 36, because the extraneous noise passes through the open and close switch 35.

The signal detector circuit 36 performs an operation of extending the detection signal of the extraneous noise 2 which has passed through the open and close switch 35 to be a long-duration signal, in order to enable the user to easily check the occurrence of the extraneous noise 2.

More specifically, the signal detector circuit 36 widens the pulse width of the detection signal of the extraneous noise 2, converts the detection signal into a long-duration pulse signal, and outputs the long-duration pulse signal, as the detection output signal 2a, to the amplifying unit 40.

The operational amplifier 41 of the amplifying unit 40 amplifies the detection output signal 2a outputted from the signal detector circuit 36 in the state in which the power supply voltage Vcc applied to the power supply terminal 7 is supplied as the power supply voltage for driving, and outputs the detection output signal 2a amplified thereby to the detection notification unit 42.

When receiving the detection output signal 2a from the amplifying unit 40, the detection notification unit 42 lights, for example, an LED lamp or the like, in order to enable the user to check the occurrence of the extraneous noise 2.

Here, although the example in which the amplifying unit 40 outputs the detection output signal 2a amplified thereby to the detection notification unit 42 is shown, the amplifying unit can output the detection output signal 2a amplified thereby to a noise rejection device or the like not illustrated.

In this Embodiment 1, it is not assumed that the switching noise 12 enters the signal line 31 from between the open and close switch 35 and the signal detector circuit 36, because the signal line 31 connecting between the open and close switch 35 and the signal detector circuit 36 is very short.

When the switching noise 12 enters the signal line 31 from between the signal detector circuit 36 and the amplifying unit 40, this switching noise 12 is not extended to be a long-duration signal by the signal detector circuit 36, and thus its signal width remains to be of the order of nsec.

Further, because the operational amplifier 41 of the amplifying unit 40 operates at a speed lower than that at which the high-speed operational amplifier 34 operates, for example, at a speed of the order of msec, the signal of the switching noise 12 whose signal width is of the order of nsec is not amplified.

Therefore, even though the signal of the switching noise 12 is outputted to the detection notification unit 42, the lighting time of the LED lamp or the like is of the order of nsec and is very short. Further, because the signal of the switching noise 12 is not amplified, the lighting brightness of the LED lamp or the like is very low. Therefore, there is a very low possibility that the switching noise 12 is erroneously detected as an extraneous noise 2, because the user hardly notices the lighting of the LED lamp or the like.

Further, when the switching noise 12 enters the signal line 31 from between the amplifying unit 40 and the detection notification unit 42, this switching noise 12 is not extended to be a long-duration signal by the signal detector circuit 36, and thus its signal width remains to be of the order of nsec. Further, the signal of the switching noise 12 is not amplified by the operational amplifier 41 of the amplifying unit 40.

Therefore, even though the signal of the switching noise 12 is outputted to the detection notification unit 42, there is a very low possibility that the switching noise 12 is erroneously detected as an extraneous noise 2, because the user hardly notices the lighting of the LED lamp or the like.

As is clear from the above description, according to this Embodiment 1, because the noise detection circuit 6 includes the open and close switch 35 connected onto the signal line 31 for transmitting a detection signal of an extraneous noise 2, and the open and close switch 35 is configured so as to be in the off state during a time period when the switching of the conduction state of the solid state switch 11 is performed by the control circuit 14, whereas the open and close switch is configured so as to be in the on state during a time period when the switching of the conduction state of the solid state switch 11 is not performed, there is provided an advantage of being able to detect an extraneous noise 2 occurring irregularly.

More specifically, there is provided an advantage of being able to detect an extraneous noise 2 without erroneously detecting, as an extraneous noise 2, a switching noise 12 occurring from the solid state switch 11.

Although in this Embodiment 1, the example in which the open and close switch 35 is connected between the high-speed amplifying unit 33 and the signal detector circuit 36 is shown, the open and close switch 35 should just be connected to a point on the signal line 31 and on an input side with respect to the signal detector circuit 36.

Figure 3:
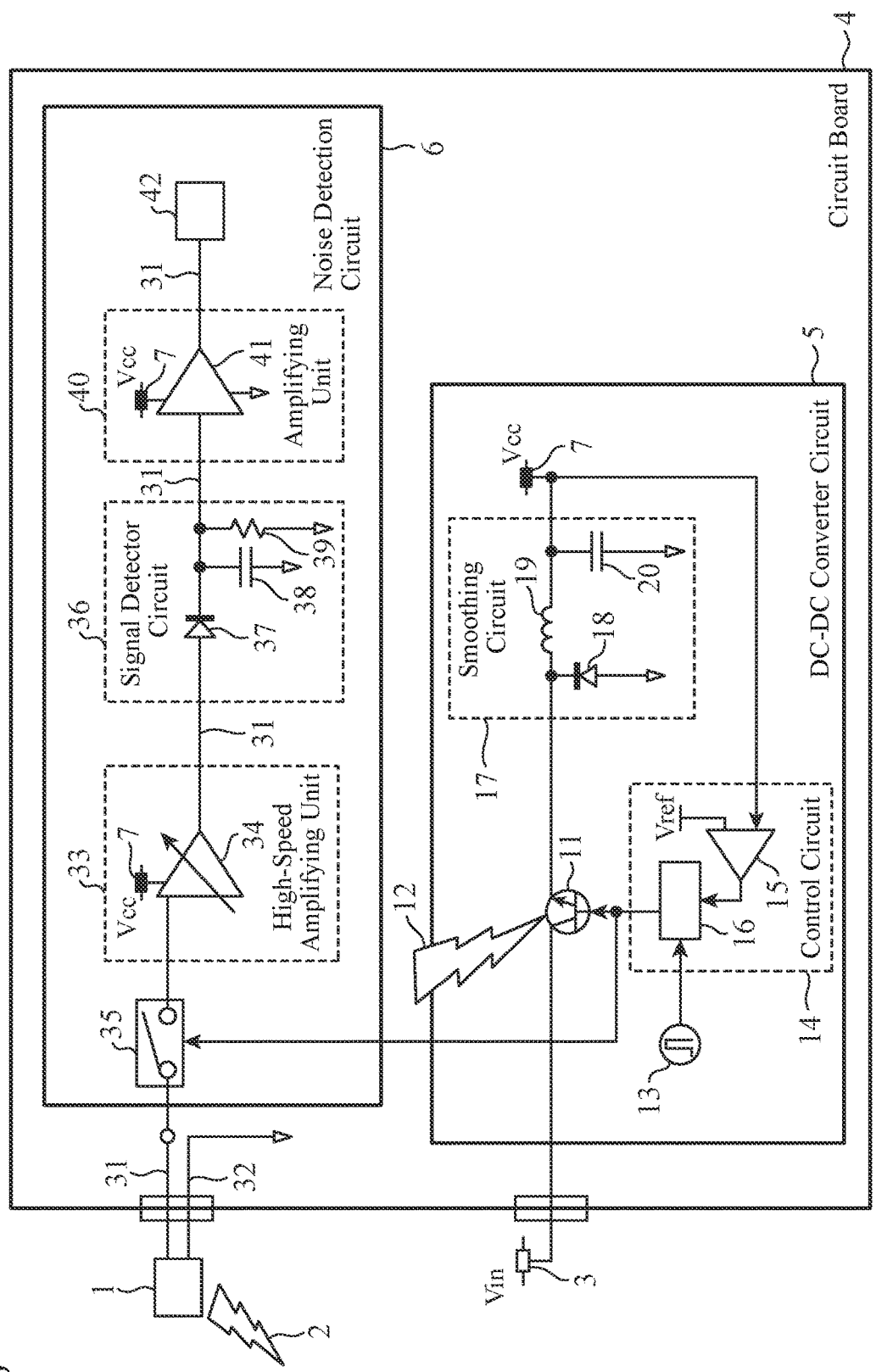
FIG. 3 is a schematic diagram showing another noise detection device according to Embodiment 1 of the present invention.

FIG. 3 is a schematic diagram showing another noise detection device according to Embodiment 1 of the present invention.

In the example of FIG. 3, the open and close switch 35 is connected between the noise detection sensor 1 and the high-speed amplifying unit 33. In FIG. 3, because the same reference numerals as those shown in FIG. 1 denote the same components or like components, an explanation of the components will be omitted hereafter.

It is to be understood that various changes can be made in any component according to the embodiment, and any component according to the embodiment can be omitted within the scope of the invention.

INDUSTRIAL APPLICABILITY

The present invention is suitable for a noise detection device that detects an extraneous noise.

REFERENCE SIGNS LIST 1 noise detection sensor, 2 extraneous noise, 2a detection output signal, 3 voltage input terminal, 4 circuit board, 5 DC-DC converter circuit, 6 noise detection circuit, 7 power supply terminal, 11 solid state switch, 12 switching noise, 13 oscillating circuit, 14 control circuit, 15 comparator, 16 control signal generating unit, 17 smoothing circuit, 18 diode, 19 inductor, 20 capacitor, 31, 32 signal line, high-speed amplifying unit, 34 high-speed operational amplifier, 35 open and close switch, 36 signal detector circuit, 37 diode, 38 capacitor, 39 resistor, 40 amplifying unit, 41 operational amplifier, and 42 detection notification unit.

The invention claimed is:

1. A noise detection device comprising:
a switching element connected between an input terminal to which a DC input voltage is applied, and a power supply terminal;
a control circuit to compare a power supply voltage applied to the power supply terminal and a threshold voltage, and to switch a conduction state of the switching element in accordance with a result of the comparison between the power supply voltage and the threshold voltage;
a noise detection sensor to detect an extraneous noise without establishing physical contact with the input terminal; and
a noise detection circuit to amplify a detection signal of an extraneous noise outputted from the noise detection sensor in a state in which the power supply voltage applied to the power supply terminal is supplied, and to output the detection signal amplified thereby,
wherein the noise detection circuit includes an open and close switch connected onto a signal line to transmit the detection signal of the extraneous noise, and
the open and close switch is in an opened state during a time period when switching of the conduction state of the switching element is performed by the control circuit, and is in a closed state during a time period when the switching of the conduction state of the switching element is not performed.

2. The noise detection device according to claim 1, wherein a smoothing circuit to smooth the power supply voltage is provided between the switching element and the power supply terminal.

3. The noise detection device according to claim 2, wherein the control circuit comprises:
a comparator to compare the power supply voltage smoothed by the smoothing circuit and the threshold voltage; and
a control signal generator, when a result of the comparison outputted from the comparator shows that the power supply voltage is less than the threshold voltage, to generate a control signal, the control signal causing the conduction state to be switched from a non-conducting state to a conducting state, and then causing the conduction state to return to the non-conducting state, and, when the result of the comparison shows that the power supply voltage is equal to or greater than the threshold voltage, to generate a control signal causing the non-conducting state to be maintained,
wherein the conduction state of the switching element is controlled in accordance with a control signal generated by the control signal generator, and
when the control signal generated by the control signal generator is the control signal causing the conduction state to be switched from the non-conducting state to the conducting state, and then causing the conduction state to return to the non-conducting state, the open and close switch is in the opened state, and when the control signal generated by the control signal generator is the control signal causing the non-conducting state to be maintained, the open and close switch is in the closed state.

4. The noise detection device according to claim 1, wherein the noise detection sensor is one of the following: an electric field probe, a magnetic field probe, and an electromagnetic field probe.

* * * * *